US009281164B2

(12) United States Patent
Wu et al.

(10) Patent No.: US 9,281,164 B2
(45) Date of Patent: Mar. 8, 2016

(54) METHOD AND APPARATUS FOR INSPECTION OF SCATTERED HOT SPOT AREAS ON A MANUFACTURED SUBSTRATE

(75) Inventors: Sean X. Wu, Fremont, CA (US); Kini Vivekanand, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 211 days.

(21) Appl. No.: 12/966,906

(22) Filed: Dec. 13, 2010

(65) Prior Publication Data

US 2012/0145894 A1 Jun. 14, 2012

(51) Int. Cl.
*H01J 37/28* (2006.01)
*H01J 37/26* (2006.01)
*H01L 21/66* (2006.01)

(52) U.S. Cl.
CPC ......... *H01J 37/265* (2013.01); *H01J 2237/202* (2013.01); *H01J 2237/2817* (2013.01); *H01L 22/12* (2013.01)

(58) Field of Classification Search
CPC .......................... H01J 37/28; H01J 2237/2817
USPC ................................... 250/307, 310
See application file for complete search history.

(56) References Cited

U.S. PATENT DOCUMENTS

| | | | |
|---|---|---|---|
| 4,475,037 A | 10/1984 | Vettiger et al. | |
| 6,642,519 B2 | 11/2003 | Ikeda | |
| 6,657,221 B2 * | 12/2003 | Nakagaki et al. | 250/559.4 |
| 7,521,676 B2 | 4/2009 | Okuda et al. | |
| 7,834,317 B2 | 11/2010 | Nakagaki et al. | |
| 2002/0171051 A1 | 11/2002 | Nakagaki et al. | |
| 2006/0108525 A1 | 5/2006 | Nakagaki et al. | |
| 2007/0194229 A1 | 8/2007 | Okuda et al. | |
| 2008/0142712 A1 * | 6/2008 | Agemura et al. | 250/310 |
| 2008/0149830 A1 | 6/2008 | Baek et al. | |
| 2009/0001267 A1 * | 1/2009 | Enyama et al. | 250/310 |
| 2009/0084954 A1 | 4/2009 | Ezumi et al. | |

(Continued)

FOREIGN PATENT DOCUMENTS

| | | |
|---|---|---|
| JP | 2002-310962 A | 10/2002 |
| JP | 2010-153277 A | 7/2010 |
| TW | 201035536 A | 10/2010 |

OTHER PUBLICATIONS

PCT International Search Report & Written Opinion of the International Searching Authority for PCT Application No. PCT/US2011/063313, 9 sheets, Jul. 16, 2012.

(Continued)

*Primary Examiner* — Robert Kim
*Assistant Examiner* — Eliza Osenbaugh-Stewart
(74) *Attorney, Agent, or Firm* — Okamoto & Benedicto LLP

(57) ABSTRACT

One embodiment relates to a method of automated inspection of scattered hot spot areas on a manufactured substrate using an electron beam apparatus. A stage holding the substrate is moved along a swath path so as to move a field of view of the electron beam apparatus such that the moving field of view covers a target area on the substrate. Off-axis imaging of the hot spot areas within the moving field of view is performed. A number of hot spot areas within the moving field of view may be determined, and the speed of the stage movement may be adjusted based on the number of hot spot areas within the moving field of view. Another embodiment relates to an electron beam apparatus for inspecting scattered areas on a manufactured substrate. Other embodiments, aspects and features are also disclosed.

15 Claims, 8 Drawing Sheets

(56) References Cited

U.S. PATENT DOCUMENTS

| | | |
|---|---|---|
| 2009/0136116 A1 | 5/2009 | Okai et al. |
| 2009/0208091 A1* | 8/2009 | Hayakawa et al. ........... 382/149 |
| 2009/0242761 A1* | 10/2009 | Yeh et al. ...................... 250/307 |
| 2009/0244078 A1* | 10/2009 | Kanai et al. ................... 345/533 |
| 2009/0309022 A1 | 12/2009 | Gunji et al. |

OTHER PUBLICATIONS

International Preliminary Report on Patentability for Application No. PCT/US2011/063313, 6 sheets, Jun. 18, 2013.

* cited by examiner

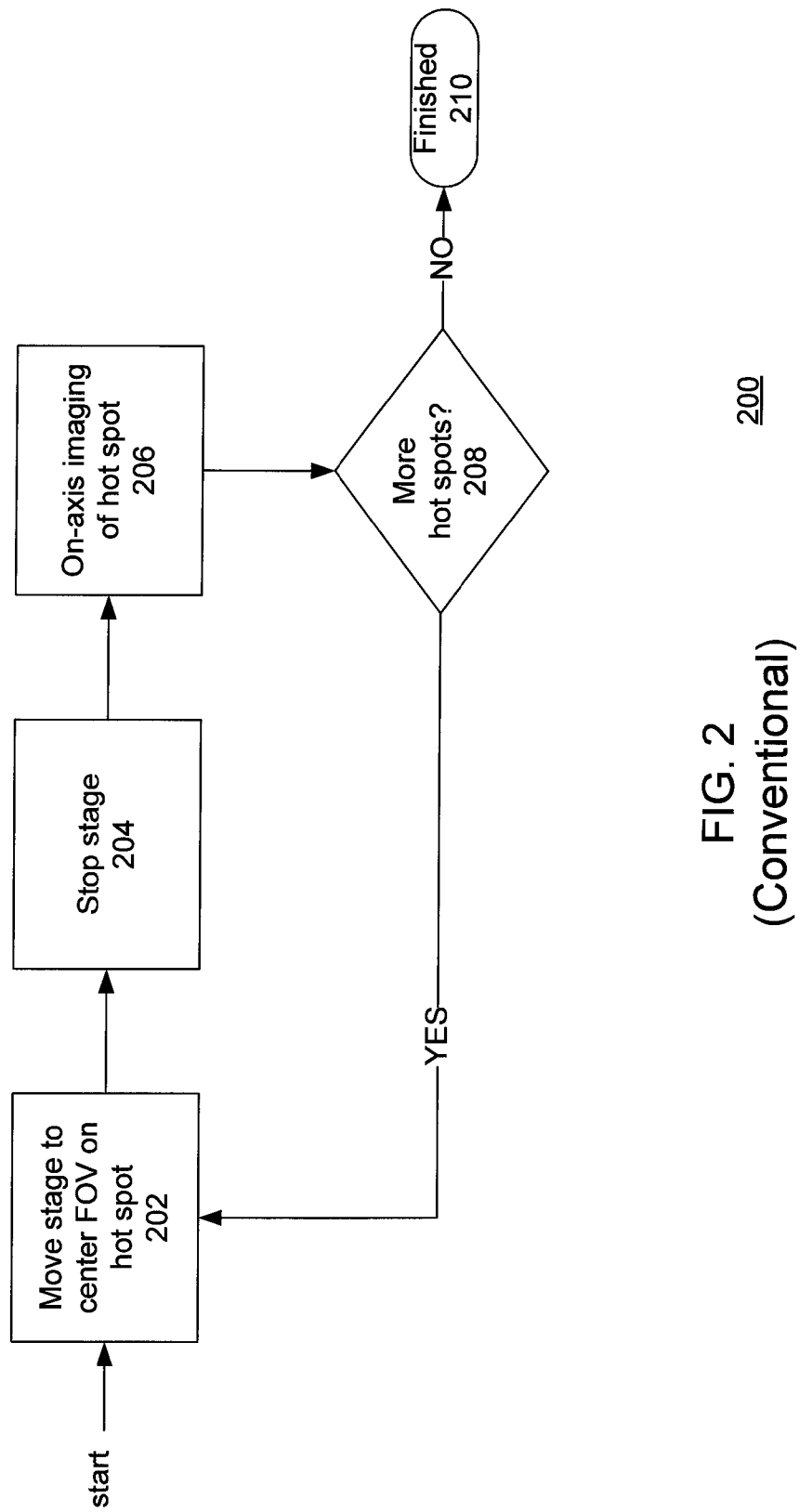
FIG. 2
(Conventional)

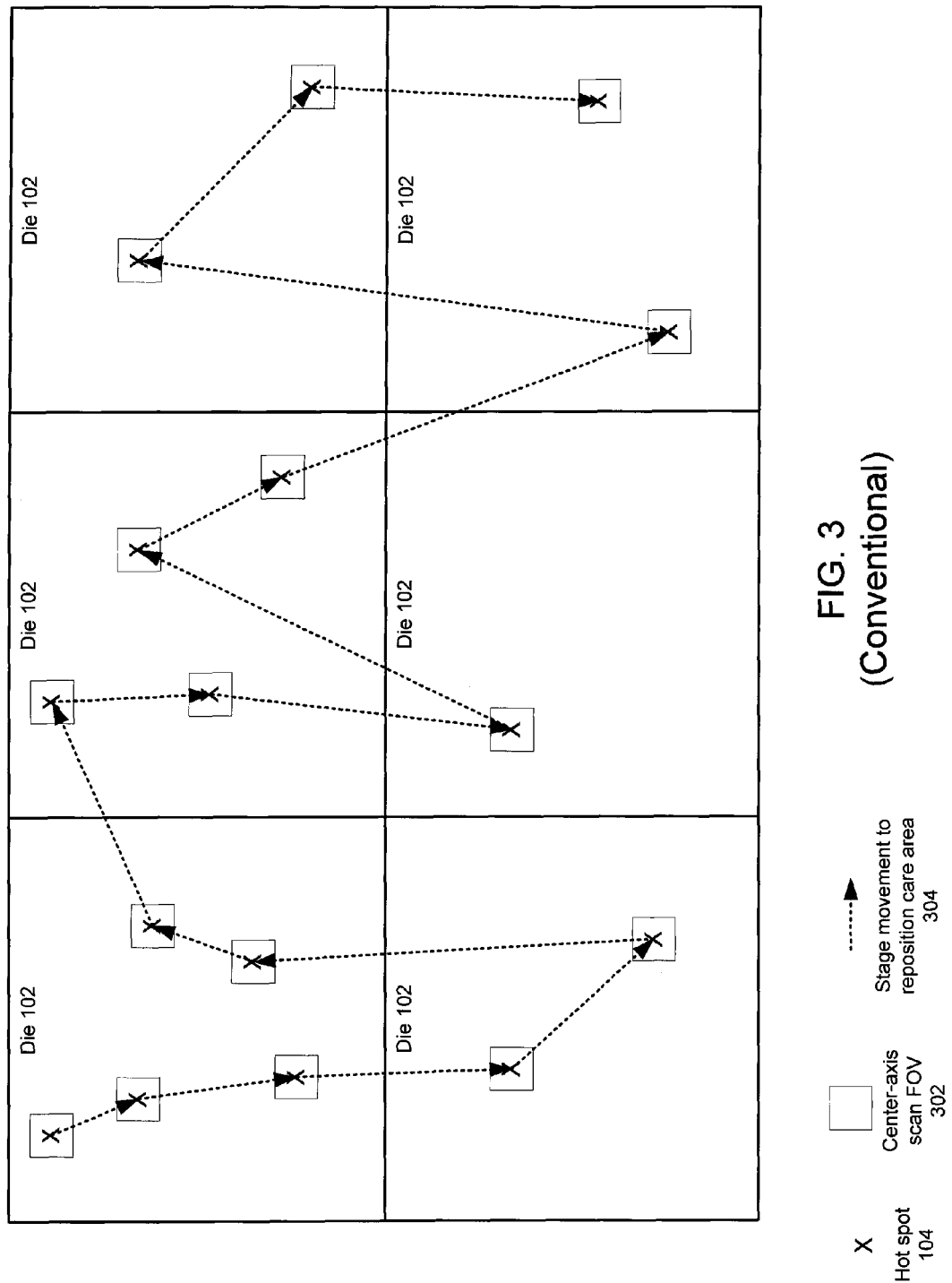
FIG. 3
(Conventional)

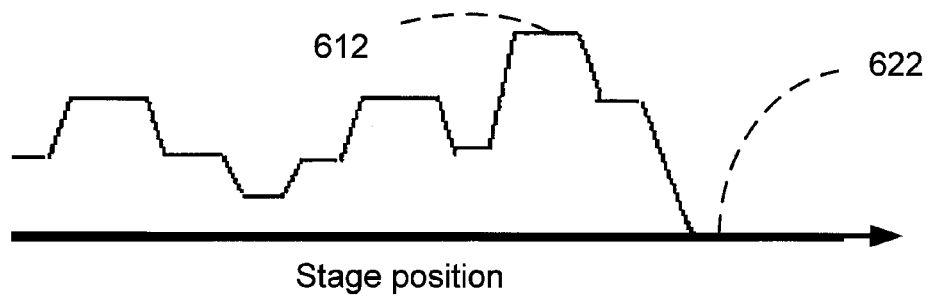
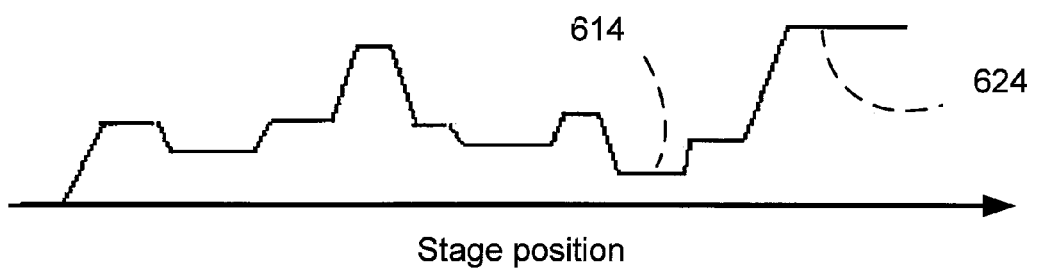
FIG. 6

METHOD AND APPARATUS FOR INSPECTION OF SCATTERED HOT SPOT AREAS ON A MANUFACTURED SUBSTRATE

BACKGROUND OF THE INVENTION

1. Field of the Invention

The present invention relates generally to the automated inspection or review of defects on manufactured substrates.

2. Description of the Background Art

A conventional scanning electron microscope (SEM) apparatus for automated inspection may be used to inspect a large number of scattered "hot spot" areas on a semiconductor wafer or other manufactured substrate. Hot spot areas are particular areas which are known or suspected to have a relatively high likelihood of one or more defects. Coordinates for the hot spot areas may be obtained either from design data or from an earlier inspection of the substrate.

Because hot spot areas may be scattered around at various positions on a manufactured substrate, the automated inspection of a large number of hot spot areas takes a substantial amount of time. This adversely impacts the throughput of the inspection apparatus.

It is highly desirable to increase the speed of inspecting a large number of hot spots on a manufactured substrate.

SUMMARY

One embodiment relates to a method of automated inspection of scattered hot spot areas on a manufactured substrate using an electron beam apparatus. A stage holding the substrate is moved along a swath path so as to move a field of view of the electron beam apparatus such that the moving field of view covers a target area on the substrate. Off-axis imaging of the hot spot areas within the moving field of view is performed. A number of hot spot areas within the moving field of view may be determined, and the speed of the stage movement may be adjusted based on the number of hot spot areas within the moving field of view.

Another embodiment relates to an electron beam apparatus for inspecting scattered areas on a manufactured substrate. The apparatus includes at least an electron source, a lens system, a detector, a stage, and a system controller. The electron source is configured to generate a primary electron beam, and the lens system is configured to focus the primary electron beam onto a surface of the substrate. The detector is configured to detect scattered electrons emitted from the substrate, and the stage is configured to hold the substrate and controllably move the substrate under the primary electron beam. The system controller is configured to control movement of a stage holding the substrate along a swath path so as to move a field of view of the electron beam apparatus such that the moving field of view covers a target area on the substrate. The system controller is also configured to control off-axis imaging of the hot spot areas within the moving field of view.

Other embodiments, aspects and features are also disclosed.

BRIEF DESCRIPTION OF THE DRAWINGS

FIG. 2 is a flow chart of a conventional method for inspecting scattered hot spot areas.

FIG. 3 depicts the conventional method for inspecting scattered hot spot areas per FIG. 2 as applied to the hypothetical example of FIG. 1.

FIG. 6 shows an example hot spot density and a corresponding swath velocity profile as a function of stage position in accordance with an embodiment of the invention.

DETAILED DESCRIPTION

Note that the figures provided herewith are not necessarily to scale. They are provided for purposes of illustration to ease in the understanding of the presently-disclosed invention.

Figure 1:
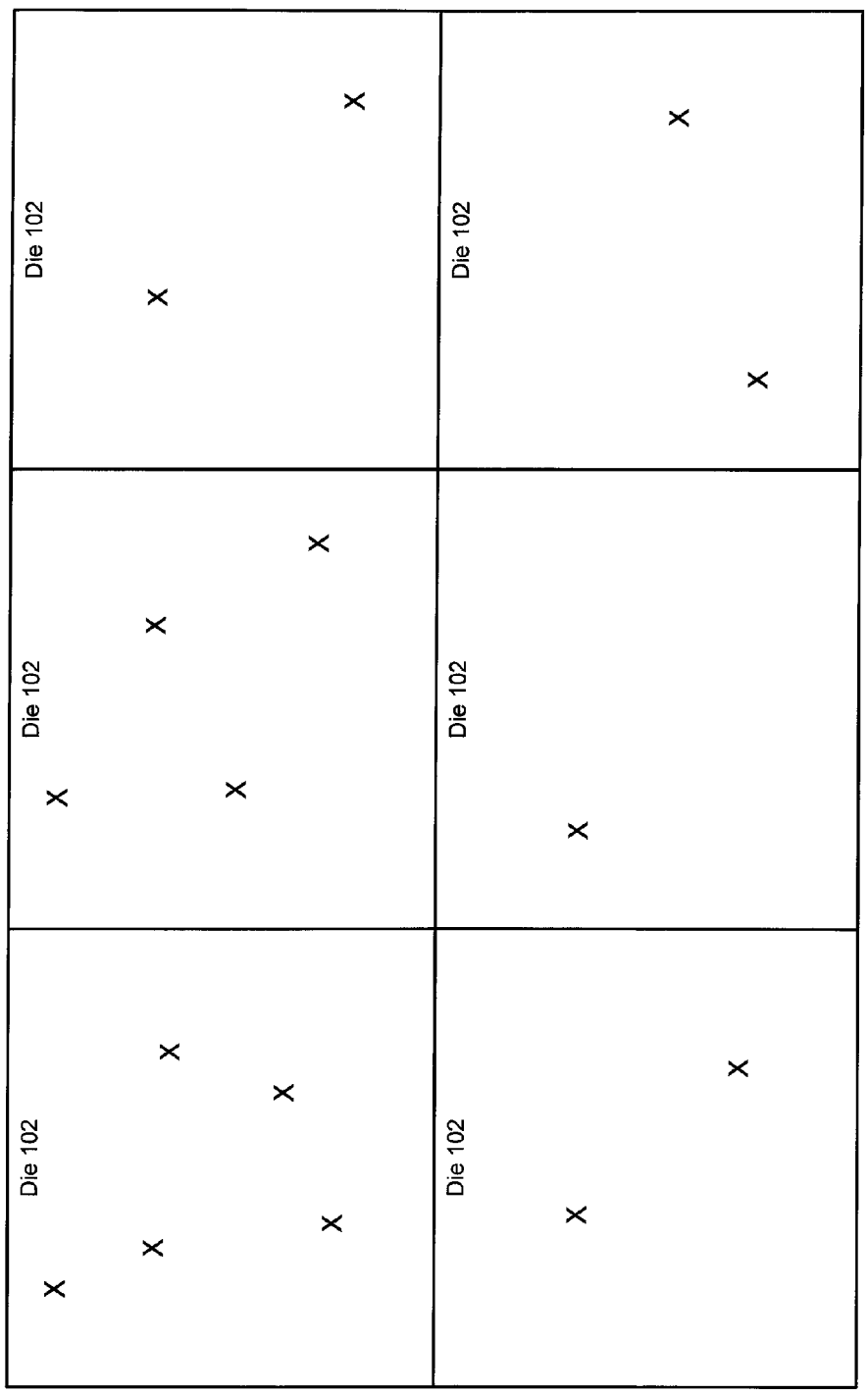
FIG. 1 depicts, for purposes of discussion, a planar view of an hypothetical example of scattered hot spot areas in an array of dies on a semiconductor wafer.

FIG. 1 depicts, for purposes of discussion, a planar view of a hypothetical example of scattered hot spot areas 104 in an array of dies 102 on a semiconductor wafer. While the example of FIG. 1 depicts an array of six dies for ease of illustration, an actual semiconductor wafer will, of course, normally have more than six dies.

As shown, the hot spot areas (each marked by an "X") 104 may be scattered at various positions on the wafer. In one implementation, the hot spot areas may be selected manually by a user based on design data and/or previous inspection results.

FIG. 2 is a flow chart of a conventional method 200 for inspecting scattered hot spot areas. In this method 200, a stage holding the wafer is moved 202 so as to center the field of view (FOV) of the electron beam inspection apparatus on a hot spot area. Thereafter, the stage motion is stopped 204, and then an on-axis imaging (e-beam scan) 206 of the hot spot area is performed. A determination 208 may then be made as to whether or not there are any more hot spot areas on the wafer to be imaged. If there are more hot spot areas to be imaged, then the method 200 loops back and the stage is moved 202 to center the FOV on the next hot spot area to be imaged. If there are no more hot spot areas to be imaged, then the hot spot scanning for this wafer is finished 210.

FIG. 3 depicts the conventional method for inspecting scattered hot spot areas per FIG. 2 as applied to the hypothetical example of FIG. 1. As shown, the stage is moved 304 to reposition the center-axis scan FOV 302 so that it is centered on a hot spot area 104. The size of the center-axis FOV 302 is limited by the specification and capabilities of the imaging apparatus, in particular, by the pixel size and the number of pixels in the detector array, for example. After that, the stage is stopped, and the hot spot area 104 in the FOV 302 is imaged by the electron beam imaging apparatus, then the stage is moved 304 to reposition the FOV 302 so that it is centered on a next hot spot area 104. The stage is again stopped, and the hot spot area 104 in the FOV 302 is imaged by the electron beam imaging apparatus. And so forth until all the hot spot areas are imaged.

Applicants have determined drawbacks and disadvantages with the above-described conventional hot spot scanning technique. In particular, the conventional technique has substantial overhead time where the inspector is not scanning the e-beam over a hot spot area to obtain image data. The substantial overhead time is due to (a) the time it takes to decelerate the stage to stop it and to accelerate the stage to get it moving again and (b) the time it takes for the stage to move in between the hot spot areas. This overhead time cannot be made very short due to the maximum stage acceleration and jerk (which is tied to the mass of the stage). Consider that the total inspection time is equal to the overhead time plus the scanning time. In certain instances, the overhead time may be as high as 30% to 40% of the total inspection time.

The present application discloses methods and apparatus for inspecting a large number of scattered hot spot areas with an automated e-beam inspection tool which may significantly increase its throughput in terms of the number of hot spots inspected per hour. As described further below, variable-speed swathing of the target substrate and off-axis scanning may be used to more rapidly scan hot spots on a target substrate under certain circumstances.

Figure 4:
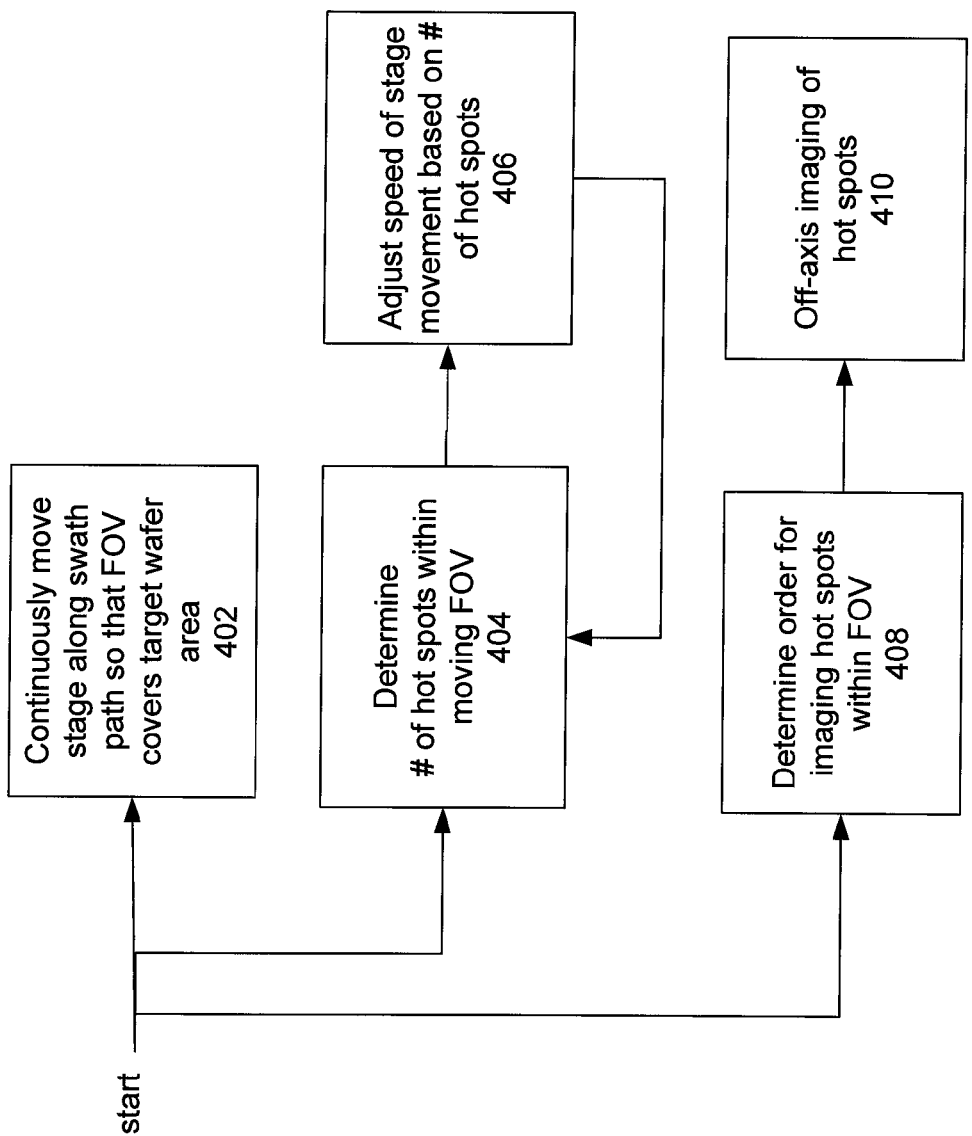
FIG. 4 is a flow chart of a method for inspecting scattered hot spot areas in accordance with an embodiment of the invention.

FIG. 4 is a flow chart of a method 400 for inspecting scattered hot spot areas in accordance with an embodiment of the invention. As shown, in this method 400, the stage is continuously moved 402 along a path. For example, the path may be a predetermined path, such as a path following a raster scan pattern, so that the FOV of the e-beam apparatus covers the target substrate area. This continuous movement advantageously reduces the overhead time required to completely stop the stage movement before imaging a hot spot and to re-accelerate the stage from a stand still after imaging the hot spot.

As further shown, the method 400 determines 404 the number of hot spot areas within the moving FOV. This is a dynamic number that changes as some hot spots drop out of the FOV while other hot spots enter the FOV. Since the FOV may be of a constant area, this number corresponds linearly to the density of hot spots within the FOV.

Based on the number (or density) of hot spots, the method 400 dynamically adjusts 406 the speed of the stage movement along the predetermined path. In general, the stage speed is reduced a higher number (or density) of hot spots in the FOV, and the stage speed is increased for a lower number (or density) of hot spots in the FOV. When the hot spot density is high, this dynamic speed adjustment provides sufficient time for the off-axis scanning of the various hot spots in the FOV. On the other hand, when the hot spot density is low, this dynamic speed adjustment reduces the time taken for the FOV to travel through that path segment (while still being able to scan the sparse population of hot spots therein). An example of how the stage speed (swath velocity) may be dynamically varied as a function of hot spot density is described below in relation to FIG. 6.

In accordance with an embodiment of the invention, any hot spot area within the FOV may be imaged by off-axis imaging (off-axis e-beam scanning). For off-axis imaging of a hot spot area, the FOV of the e-beam apparatus is not centered on the hot spot area. In other words, the optical axis of the electron beam column is not positioned to be within the hot spot area.

If there are multiple hot spot areas within the moving FOV, then the order for scanning the hot spot areas may also be determined 408 in this method 400. An example order of scanning multiple hot spot areas within a FOV is described below in relation to FIG. 7.

Although off-axis imaging of the hot spot areas may result in an increase in aberrations in the scanned data, the applicants believe that this drawback is more than offset, in some circumstances, by a decrease in total inspection time when a higher throughput of the inspection apparatus is desired. The total inspection time may substantially decrease due to the avoidance of the need to stop the stage motion after centering the FOV on each hot spot area and re-accelerate the stage motion after that hot spot area is imaged.

Figure 5:
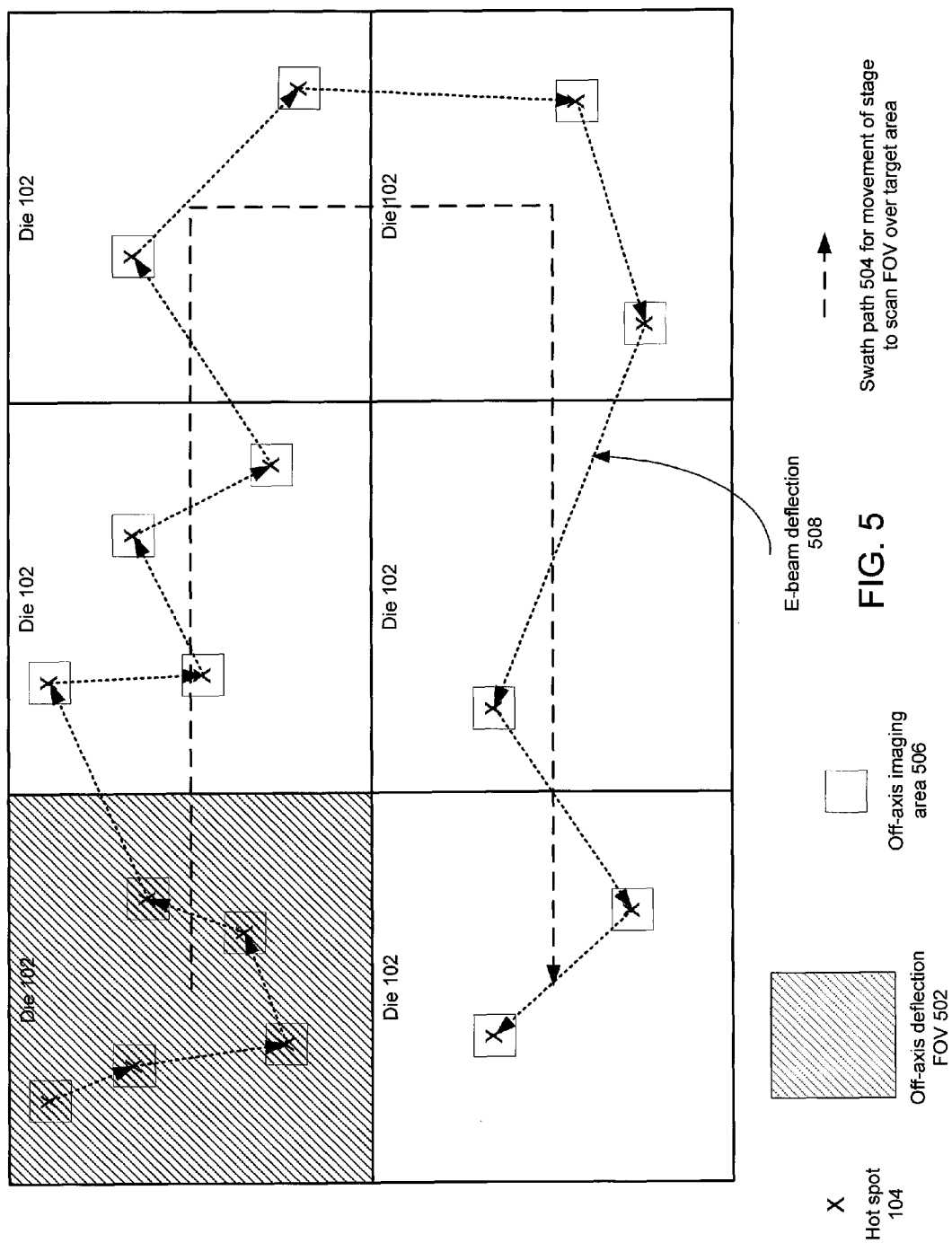
FIG. 5 depicts the method for inspecting scattered hot spot areas per FIG. 4 as applied to the hypothetical example of FIG. 1.

FIG. 5 depicts the method for inspecting scattered hot spot areas per FIG. 4 as applied to the hypothetical example of FIG. 1. As discussed above in relation to FIG. 4, the stage is continuously moved 402 along a swath path 504 so that the off-axis deflection FOV 502 covers the target wafer area.

Note that the off-axis deflection FOV 502 is not tied to the imaging capabilities of the apparatus (such as the pixel size and number of pixels of the detector array) and so may be 50 to 100 times (or more) larger than the center-axis scan FOV 302 of the conventional method 300. In the example illustration of FIG. 5, the off-axis deflection FOV 502 is the size of a single die 102, but the off-axis deflection FOV 502 need not be tied to the die size and may depend on the off-axis imaging capabilities of the electron beam apparatus.

The example swath path 504 illustrated is a swath or raster pattern with lines that are spaced by no more than the width of the FOV 502 in that dimension such that the area may be covered without gaps. The dimensions of the FOV 502 may be sufficiently large relative to the density of the hot spots 104 such that more than one hot spot may be present in the FOV 502 at the same time. As shown, the stage movement may turn around at the end of each line of the pattern.

As the FOV 502 is moved (swathed) to cover the area of the target substrate, hot spots 104 move into and out of the FOV 502. As discussed above in relation to FIG. 4, the speed of the stage motion (the swath velocity) may be dynamically adjusted 406 based on the number of hot spots within the moving FOV 502. A swath velocity profile corresponding to an example hot spot density within the FOV 502 is discussed below in relation to FIG. 6.

When at least hot spot area is present within the FOV 502, then an off-axis imaging (e-beam scanning) 410 of the hot spot area(s) may be performed. The off-axis nature of the imaging refers to the fact that, unlike the method discussed above in relation to FIGS. 2 and 3, the FOV 502 is not moved so as to be centered on each hot spot area before the imaging of that hot spot area is performed. Rather, the center of the FOV 502 remains along the swath path 504 to scan the FOV over the target area.

As discussed above in relation to FIG. 4, if there are multiple hot spot areas present in the FOV 502, then an order may be determined 408 for imaging the hot spots within the FOV 502. An example determination of order for imaging hot spot areas for a FOV 502 with several hot spots therein is discussed further below in relation to FIG. 7.

FIG. 6 shows an example hot spot density 602 within a FOV and a corresponding swath velocity profile 604 as a function of stage position in accordance with an embodiment of the invention. As shown, lower swath velocities (speeds) correspond to higher hot spot densities, and higher swath velocities correspond to lower hot spot densities. For example, the relatively low speed at point 614 corresponds to the relatively high hot spot density at point 612. As another example, the zero hot spot density at point 622 corresponds to the maximum speed at point 624.

Figure 7:
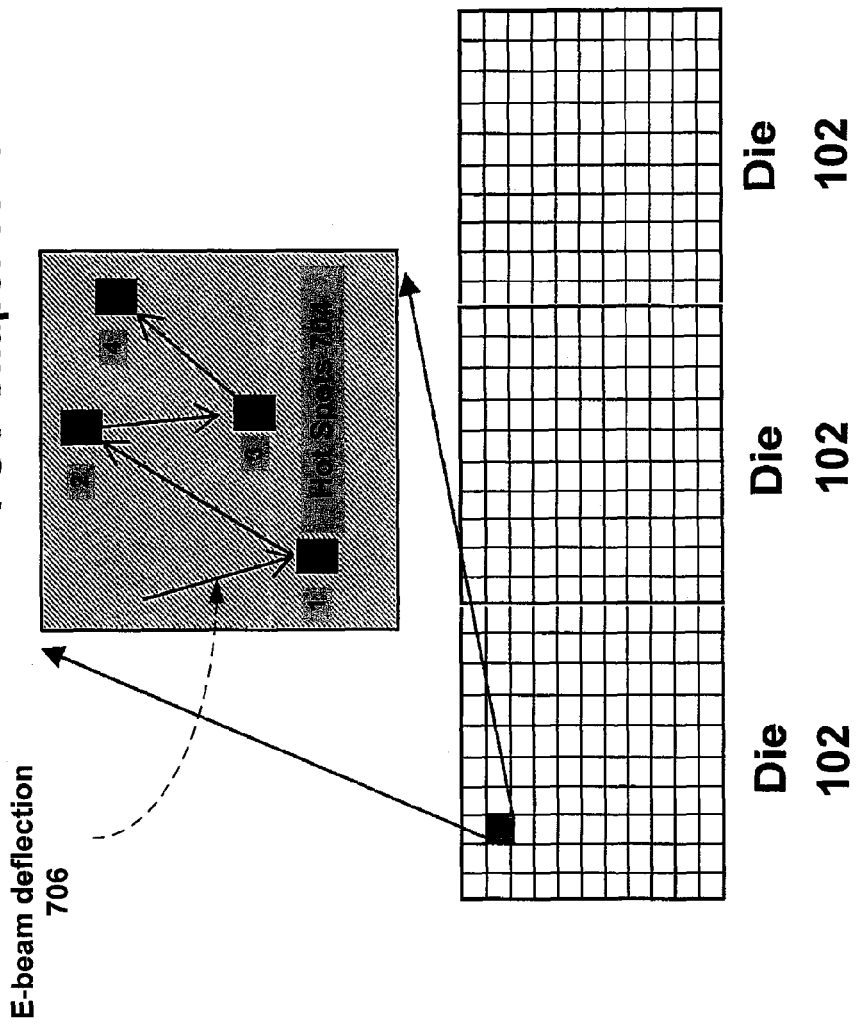
FIG. 7 is a schematic diagram depicting an order for scanning hot spots within a field of view in accordance with an embodiment of the invention.

FIG. 7 is a schematic diagram depicting an order for scanning hot spots within a field of view in accordance with an embodiment of the invention. The figure shows an expanded view of the off-axis deflection FOV 502 at an example point in time ("the FOV snapshot" 702). Within the example FOV snapshot 702 are shown for hot spot areas 704. Numbers adjacent to the four hot spot areas 704 indicates an exemplary order in which the hot spots within the FOV snapshot 702 may be imaged (scanned by the electron beam). In this exemplary order, hot spot number 1 is scanned, then number 2, then number 3, and then number 4.

For example, hot spot number 1 may be determined to be first in the order because it is the hot spot that will be first to exit the moving FOV. Hot spot number 2 may be determined to be second in the order because it is the hot spot that will be second to exit the moving FOV. Hot spot number 3 may be determined to be third in the order because it is the hot spot that will be third to exit the moving FOV. Finally, hot spot number 4 may be determined to be fourth in the order because it is the hot spot that will be fourth to exit the moving FOV. In other words, in this example, hot spot number n may be determined to be nth in the order because it is the hot spot that will be nth to exit the moving FOV.

Figure 8:
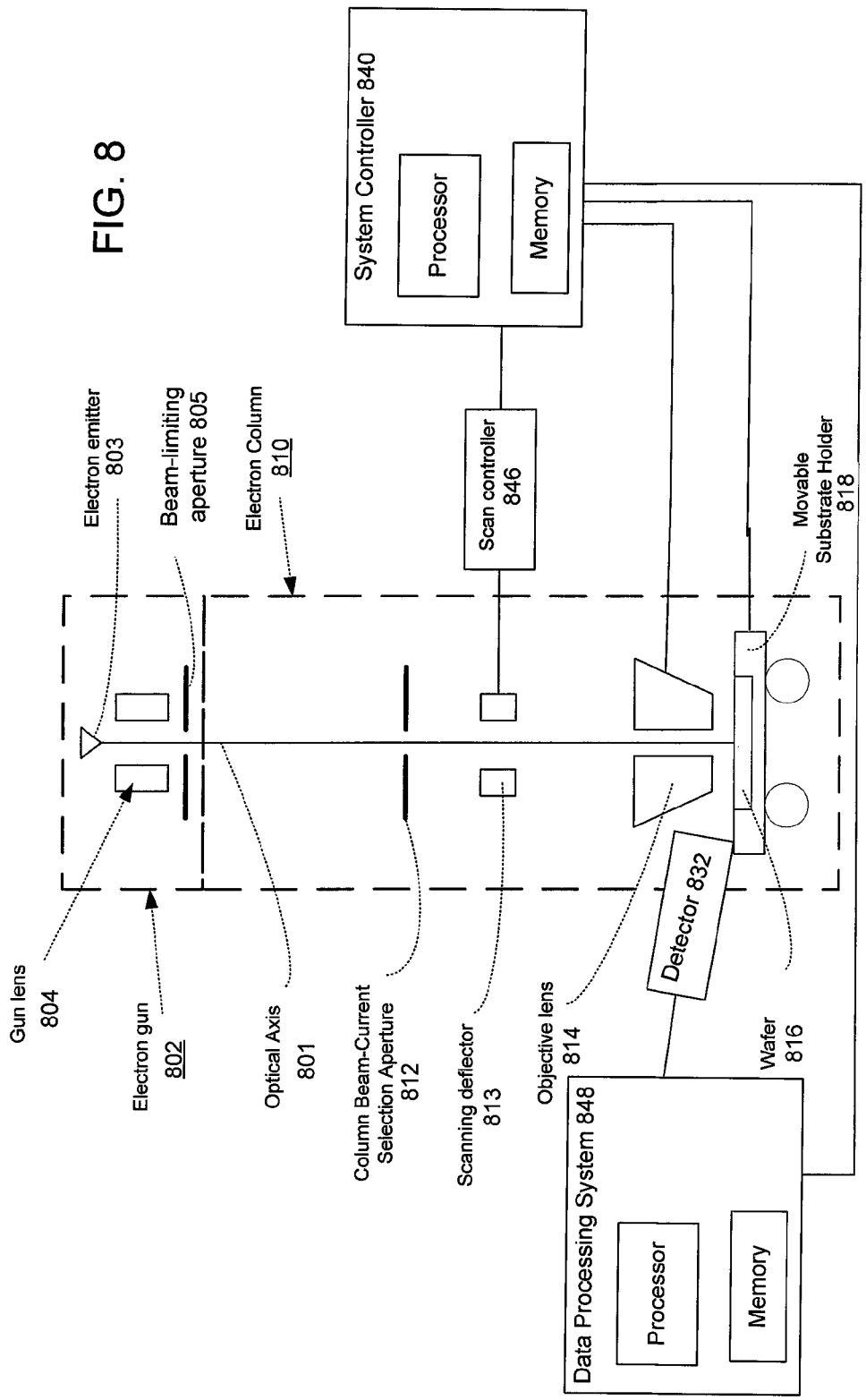
FIG. 8 is a cross-sectional diagram of a scanning electron microscope configured for automated defect inspection in accordance with an embodiment of the invention.

FIG. 8 is a cross-sectional diagram of a scanning electron beam (e-beam) apparatus configured for automated defect inspection in accordance with an embodiment of the invention. As shown, the e-beam apparatus includes an electron gun 802 and an electron-beam column (electron column) 810.

In the electron gun 802, the electron emitter 803 is a source of electrons, and the gun lens 804 focuses the emitted electrons to form an electron beam. The beam-limiting aperture 805 may be utilized to limit the size of the beam exiting the electron gun 802 and entering into the electron column 810 along the optical axis 801 of the column.

In the electron column 810, the column beam-current selection aperture 812 may be used to select a desired beam current with which to illuminate the target semiconductor wafer (or other target substrate) 816. A scanning deflector 813 may be configured to controllably scan (for example, raster scan) the beam across an area of the wafer 818, and a scan controller 846 may be coupled to the scanning deflector 813 and used to control said deflection.

The objective lens 814 is configured to focus the controllably deflected beam onto the wafer 816. A movable substrate holder 818 may be configured to hold the wafer 816 and transport (move) the wafer 816 under the electron column 810 for the purpose of automated inspection and/or review of defects, or automated measurement of critical dimensions, as part of a semiconductor manufacturing process.

A detector 832 is arranged to detect secondary electrons (and/or backsignal electrons), and a data processing system 848 coupled to the detector 832 is used to store and process the detected data so as to be able to form useful images for analysis.

The apparatus further includes a system controller 840. The system controller 840 may include a processor, memory for executable instructions and data, and various other components. The system controller 840 may be communicatively coupled to the scan controller 846, the data processing system 848, and various other components of the apparatus (such as voltage or current sources for various lenses, and so forth). The data processing system 848 may also include a processor, memory for executable instructions and data, and various other components.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of automated inspection of scattered hot spot areas on a manufactured substrate using an electron beam apparatus, the method comprising:

moving a stage holding the substrate at variable speed along a swath path so as to move a field of view of the electron beam apparatus such that the moving field of view covers with dynamically varying speed a target area on the substrate, wherein the swath path is fixed in that the swath path does not vary depending on locations of the hot spot areas; and off-axis imaging of the hot spot areas within the moving field of view while the stage continues moving without deviation from the swath path;

determining a number of hot spot areas within the moving field of view;

adjusting the variable speed of the stage movement based on the number of hot spot areas within the moving field of view with a maximum speed corresponding to a zero hot spot density and multiple lower speeds corresponding to higher hot spot densities, wherein the variable speed as a function of stage position forms a profile that has sloped ramps in speed connecting constant speed levels;

adjusting the variable speed of the stage movement such that the variable speed of the stage movement transitions in a downward sloped ramp from a first constant speed level to a second constant speed level, wherein the first constant speed level is higher than the second constant speed level, the first constant speed level is associated with a first hot spot density that is greater than zero, and the second constant speed level is associated with a second hot spot density that is greater than the first hot spot density; and adjusting the variable speed of the stage movement such that the variable speed of the stage movement transitions in an upward sloped ramp from a third constant speed level to a fourth constant speed level, wherein the third constant speed level is lower than the fourth constant speed level, the third constant speed level is associated with a third hot spot density, the fourth constant speed level is associated with a fourth hot spot density that is greater than zero and less than the third hot spot density.

2. The method of claim 1, further comprising:

determining an order for imaging the hot spots within the moving field of view; and imaging the hot spot areas within the moving field of view in the determined order.

3. The method of claim 1, wherein the swath path is predetermined, and the stage is moved continuously along the swath path.

4. The method of claim 3, wherein the stage movement is not stopped during the off-axis imaging.

5. The method of claim 3, wherein the swath path comprises a raster pattern, and wherein the stage movement turns around at an end of each line of the raster pattern.

6. An electron beam apparatus for inspecting scattered areas on a manufactured substrate, the apparatus comprising:
   an electron source for generating a primary electron beam;
   a lens system configured to focus the primary electron beam onto a surface of the substrate;
   a detector configured to detect scattered electrons emitted from the substrate;
   a stage configured to hold the substrate and controllably move the substrate under the primary electron beam; and
   a system controller configured to
      control movement of a stage holding the substrate at variable speed along a swath path so as to move a field of view of the electron beam apparatus such that the moving field of view covers with dynamically varying speed a target area on the substrate, wherein the swath path does not vary depending on locations of the scattered areas,
      control off-axis imaging of the scattered areas within the moving field of view,
      determine a number of the scattered areas within the moving field of view,
      adjust the variable speed of the stage movement based on the number of the scattered areas within the moving field of view with a maximum speed corresponding to a zero density of the scattered areas in the moving field of view and multiple lower speeds corresponding to higher densities of the scattered areas in the moving field of view, wherein the variable speed as a function of stage position forms a profile that has sloped ramps in speed connecting constant speed levels,
      adjust the variable speed of the stage movement such that the variable speed of the stage movement transitions in a downward sloped ramp from a first constant speed level to a second constant speed level, wherein the first constant speed level is higher than the second constant speed level, the first constant speed level is associated with a first density of the scattered areas in the moving field of view that is greater than zero, and the second constant speed level is associated with a second density of the scattered areas in the moving field of view that is greater than the first density, and
      adjust the variable speed of the stage movement such that the variable speed of the stage movement transitions in an upward sloped ramp from a third constant speed level to a fourth constant speed level, wherein the third constant speed level is lower than the fourth constant speed level, the third constant speed level is associated with a third density of the scattered areas in the moving field of view, the fourth constant speed level is associated with a fourth density of the scattered areas in the moving field of view that is greater than zero and less than the third density.

7. The apparatus of claim 6, wherein the system controller is further configured to determine an order for imaging the scattered areas within the moving field of view and to scan the scattered areas within the moving field of view in the determined order.

8. The apparatus of claim 6, wherein the swath path is predetermined, and the stage is moved continuously along the swath path.

9. The apparatus of claim 8, wherein the stage movement is not stopped during the off-axis imaging.

10. The apparatus of claim 8, wherein the swath path comprises a raster pattern, and wherein the stage movement turns around at an end of each line of the raster pattern.

11. An electron beam apparatus for inspecting scattered areas on a manufactured substrate, the apparatus comprising:
   a scan controller for controlling deflection of an electron beam onto the substrate; and
   a system controller coupled to the scan controller and comprising a processor and memory for executable instructions and data, wherein the system controller
      controls movement of a stage holding the substrate at variable speed along a swath path so as to move a field of view of the electron beam apparatus such that the moving field of view covers with dynamically varying speed a target area on the substrate, wherein the swath path does not vary depending on locations of the scattered areas,
      controls off-axis imaging of the scattered areas within the moving field of view, determines a number of the scattered areas within the moving field of view,
      adjusts the variable speed of the stage movement based on the number of the scattered areas within the moving field of view with a maximum speed corresponding to a zero density of the scattered areas in the moving field of view and multiple lower speeds corresponding to higher densities of the scattered areas in the moving field of view, wherein the variable speed as a function of stage position forms a profile that has sloped ramps in speed connecting constant speed levels, wherein the system controller,
      adjusts the variable speed of the stage movement such that the variable speed of the stage movement transitions in a downward sloped ramp from a first constant speed level to a second constant speed level, wherein the first constant speed level is higher than the second constant speed level, the first constant speed level is associated with a first density of the scattered areas in the moving field of view that is greater than zero, and the second constant speed level is associated with a second density of the scattered areas in the moving field of view that is greater than the first density, and
      adjusts the variable speed of the stage movement such that the variable speed of the stage movement transitions in an upward sloped ramp from a third constant speed level to a fourth constant speed level, wherein the third constant speed level is lower than the fourth constant speed level, the third constant speed level is associated with a third density of the scattered areas in the moving field of view, the fourth constant speed level is associated with a fourth density of the scattered areas in the moving field of view that is greater than zero and less than the third density.

12. The apparatus of claim 11, wherein the system controller is further determines an order for imaging the scattered areas within the moving field of view and causes scanning of the scattered areas within the moving field of view in the determined order.

13. The apparatus of claim 11, wherein the swath path is predetermined, and the stage is moved continuously along the swath path.

14. The apparatus of claim 11, wherein the stage movement is not stopped during the off-axis imaging.

15. The apparatus of claim 11, wherein the swath path comprises a raster pattern, and wherein the stage movement turns around at an end of each line of the raster pattern.

* * * * *